United States Patent [19]

Ahn

[11] Patent Number: 5,134,086
[45] Date of Patent: Jul. 28, 1992

[54] METHOD FOR MANUFACTURING CAPACITOR OF HIGHLY INTEGRATED SEMICONDUCTOR MEMORY DEVICE

[75] Inventor: Ji-hong Ahn, Seoul, Rep. of Korea

[73] Assignee: Samsung Electronics Co., Ltd., Kyunggi, Rep. of Korea

[21] Appl. No.: 784,534

[22] Filed: Oct. 29, 1991

[30] Foreign Application Priority Data

Mar. 20, 1991 [KR] Rep. of Korea ............ 91-4397

[51] Int. Cl.$^5$ .................................... H01L 21/70
[52] U.S. Cl. .............................. 437/52; 437/47; 437/48; 437/60; 437/228; 437/233; 437/919; 437/977
[58] Field of Search ............ 437/47, 48, 52, 60, 437/186, 193, 195, 200, 228, 233, 235, 919, 977; 148/DIG. 138; 357/23.6; 156/653, 654

[56] References Cited

FOREIGN PATENT DOCUMENTS 0042161  2/1989  Japan .

OTHER PUBLICATIONS

Yoshimaru et al., "Ragged Surface Poly-Si and Low Temperature Deposited Si$_3$N$_4$ for G4 mBit and Beyond STC Dram Cell", IEDM, 1990, pp. 659–662.

T. Mine et al., "Capacitance Enhanced Stacked Capacitor with Engraved Storage Electrode for Deep Submicron Drams" 21s Conf. on Solid State Device and Materials, 1989, pp. 137–140.

Sako et al., "A Capacitor-Over-Bit Line Cell with Hemispherical Grain Storage Node for 64 mb Drams," IEDM 90, 654–58.

Sakao, M., Kasai, N., Ishijima, T., Ikawa, E., Watanabe, H., Terada, K. and Kikkawa, T., "A Capacitor-Over-Bit-Line (COB) Cell With A Hemispherical-Grain Storage Node For 64Mb DRAMs"; 1990 IEEE, IEDM 90-656-90-658.

Uemoto, Y., Fujii, E., Nakamura, A. and Senda, K., "A High-Performance Stacked-CMOS SRAM Cell by Solid Phase Growth Technique," 1990 IEEE, 1990 Symposium on VLSI Technology, 21–22.

*Primary Examiner*—Tom Thomas
*Attorney, Agent, or Firm*—Cushman, Darby & Cushman

[57] ABSTRACT

A method for manufacturing a capacitor of a highly integrated semiconductor memory device including a plurality of memory cells, each of which has a transistor and a capacitor. The method comprises the steps of forming an insulating layer for insulating the transistor, forming a contact hole to electrically connect to a source region by etching the insulating layer, sequentially forming a first polycrystalline silicon layer, an oxide layer, and a second polycrystalline silicon layer consisting of grains, exposing the second polycrystalline silicon layer to an oxide etchant, partially etching the oxide layer by the oxide etchant penetrating along the peripheries of the grains, anistropically etching the whole second polycrystalline silicon layer and, at the same time, the partial first polycrystalline silicon layer also, using the oxide layer being unaffected by the oxide etchant, as a mask, removing the oxide layer, forming a storage electrode by defining into cell units the first polycrystalline silicon layer, sequentially forming a dielectric film and a plate electrode formed of a third polycrystalline silicon layer over the resultant structure. Thus, the physical properties of the material itself is used without any specific conditions and unrestricted by limitation of minimum feature size. Furthermore, the process is greatly simplified and the effective capacitance of the cell capacitor is easily extended.

23 Claims, 9 Drawing Sheets

METHOD FOR MANUFACTURING CAPACITOR OF HIGHLY INTEGRATED SEMICONDUCTOR MEMORY DEVICE

BACKGROUND OF THE INVENTION

1. Field of the Invention

The present invention relates generally to a method for manufacturing semiconductor memory devices, and more particularly to a method for manufacturing a capacitor of a highly integrated semiconductor memory device having increased cell capacitance provided by grains formed within polycrystalline silicon layers.

2. Description of the Prior Art

In case of DRAMs, increased cell capacitance improves the R/W capability and decreases the soft error rate in a memory cell, so it plays an important role in the improvement of a cell's memory characteristics. Due to increased packing density in memory cells, unit cell area has decreased per chip, which in turn reduces the area available for the cell capacitor. Therefore, the increase of capacitance per unit area together with increased packing density are necessary in tandem.

In recent years, many research reports have been issued concerning increased cell capacitance, most of them related to the structure of the cell capacitor's storage electrode. They include: the fin-structure electrode of Fujitsu Co., the BOX structure and SSC (Spread-Stacked Cell) structure electrodes of Toshiba Co., and the cylindrical structure electrode of Mitsubishi Co. However, attempts to increase cell capacitance by improving the structure of the storage electrode, have met with problems such as limitation of minimum feature size and a high error rate involved in complex manufacturing processes. It is accordingly doubtful whether an improved structure of a storage electrode is practical. Yet, in order to overcome the aforesaid problems, the need for a new manufacturing method for a cell capacitor increases further.

A method for increasing cell capacitance has been proposed which utilizes the physical properties of the material forming the storage electrode independently of the structural improvement of the storage electrode. An example was presented in the 1990 IEEE entitled "A capacitor-over-bit line (COB) cell with a hemispherical-grain storage node for 64 Mb DRAMs" by NEC Co. of Japan.

FIG. 1 is a layout used for manufacturing the COB cell structure described in the above paper. The layout is not the main object of the present invention, but it will be described for its useful effect in manufacturing the device of the present invention.

The region designated by a laterally extending single-dotted line is a mask pattern P1 for forming an active region. The regions defined by solid lines are symmetrically arranged around a longitudinal center and represent a mask pattern P2 for forming gate electrodes. The regions designated by long-dashed lines in the shape of two arms of a vane balancing around the longitudinal center are a mask pattern P3 for forming local interconnects by which a source region is connected to a storage electrode. The region defined by a laterally extending double-dotted line which has a contact mark therein, represents a mask pattern P4 for forming a bit line. The regions designated by short-dashed lines surrounding oblique-lined areas are a mask pattern P5 for forming the storage electrode.

The COB (Capacitor-Over-Bit line) cell is one where a cell capacitor is formed over a bit line, and the process for COB manufacturing is as follows. After the bit line is formed to be connected to a drain region of a transistor, the bit line is electrically insulated by coating an insulating material on the whole surface of a substrate. Then, the insulating material is partially removed, thereby exposing the region electrically connected to the source region of a transistor. In doing so, a storage electrode is formed on the insulating material, and is connected to the source region of the transistor through the partially exposed portion of the insulating material. This is suitable for 64 Mbit and 256 Mbit DRAM cells, and was introduced for preventing bit line contact failures.

FIG. 2A to FIG. 2D are cross sectional views illustrating a conventional method for manufacturing a capacitor of a highly integrated semiconductor memory device.

The polycrystalline silicon with hemispherical-grains described in the above-mentioned paper (hereafter, referred to as HSG polycrystalline silicon) is formed by means of physical phenomena especially occurring while amorphous silicon is in a transitional state to polycrystalline silicon. When amorphous silicon is deposited on a semiconductor substrate and then annealed, the amorphous silicon forms minute hemispherical-grains, under specified conditions: 550° C. at 1.0 torr. Then, the surface of the amorphous silicon upon an intermediate state becomes uneven polycrystalline silicon which increases the surface area to two or three times that of the smooth surface thereof.

FIG. 2A shows an insulating layer 22 (strictly speaking, two or three stacked insulating layers) formed over the whole surface of the semiconductor substrate 10, on which both a local interconnect 20 in contact with the source region of a transistor and a bit line in contact with the drain region, have been formed. Thereafter, a contact hole 9 is formed by anisotropic etching in order to expose a portion of the local interconnect. Then, the contact hole is completely filled with a first polycrystalline silicon which is formed to a predetermined thickness on the insulating layer. Finally, an etching process is performed, using the mask pattern P5, whereby a core storage electrode 30 is formed per each cell unit.

FIG. 2B shows an HSG polycrystalline silicon layer 32 formed over the whole surface of the substrate 10 on which the core storage electrode 30 has been formed. This is formed by an ordinary method, e.g., LPCVD (Low-Pressure Chemical Vapor Deposition) under specified conditions of temperature and pressure, i.e., at 550° C. and 1.0 torr, respectively. Because of the small hemispherical grains, the effective area of the HSG polycrystalline silicon layer is increased to roughly twice that of conventional polycrystalline silicon layers without the HSG. Here, since the HSG is about 80nm in diameter, the HSG polycrystalline silicon layer should be at least 80nm thick and should be narrower than half of a core storage electrode spacing.

FIG. 2C shows the HSG polycrystalline silicon layer 32 etched back by an RIE (Reactive Ion Etching) method, using HBr gas without any etching masks, and this is carried out until portions of the insulating layer 22 between each core storage electrode 30 are exposed to divide the storage electrode into cell units. Also during this step, the HSG polycrystalline silicon coated on the upper surface of the core storage electrode is completely removed and the surface is left uneven, but on the surface of the core storage electrode only. The HSG polycrystalline silicon 32a remaining on the side surfaces of the core storage electrode is somewhat smoothed. The storage electrode is formed by the core storage electrode having the uneven upper surface and the HSG polycrystalline silicon layer 32a remaining on the side surfaces of the core storage electrode after the etching process.

After a dielectric film 34 is formed (see FIG. 2D) on the whole surface of the storage electrode, a plate electrode 36 is formed by coating a second polycrystalline silicon on the whole surface of the structure obtained by the above, whereby the cell capacitor is completed.

In the above-described method for manufacturing a capacitor of a memory cell, the physical properties of the material forming the storage electrode are used, independently of the structural improvement of the storage electrode, to extend the effective area of the cell capacitor. Therefore, the above scheme is advantageous because cell capacitor formation is simplified and free from limitations of minimum feature size. However, required processing conditions, necessary for successful product formation such as the specific temperature and pressure, demand that a margin of error during processing be overly narrow. Moreover, an increase of effective capacitance per unit area is limited to approximately two times that of previous methods.

SUMMARY OF THE INVENTION

The object of the present invention is to provide a method for manufacturing a capacitor of a highly integrated semiconductor memory device enabling the effective area of a cell capacitor to increase without requiring any specific conditions.

To accomplish the above object, according to one aspect of the present invention, there is provided a manufacturing method of a capacitor of a highly integrated semiconductor memory device. The memory device includes a plurality of memory cells regularly arranged on a semiconductor substrate, each of which has a transistor having a source region, a drain region and a gate electrode, and a capacitor having a storage electrode, a dielectric film and a plate electrode. The storage electrode is electrically connected to the source region of the transistor. The method comprises the steps of forming an insulating layer for insulating the transistor, forming a contact hole in the insulating layer to expose the source region by etching the insulating layer, forming a first polycrystalline silicon layer on the whole surface of the insulating layer having the contact hole therein, forming an oxide layer over the first polycrystalline silicon layer, forming a second polycrystalline silicon layer over the oxide layer, dipping the semiconductor substrate having the second polycrystalline silicon layer thereon into an oxide etchant, and partially etching the oxide layer by the oxide etchant penetrating the periphery of grains constituting the second polycrystalline silicon layer, completely removing the second polycrystalline silicon layer and, at the same time, partially removing the first polycrystalline silicon layer, by an anisotropic etching using the remaining oxide layer, which was unaffected by the oxide etchant, as a mask, removing the remaining oxide layer, forming a storage electrode by removing a portion of the first polycrystalline layer having the partially removed surface, forming a dielectric film over the whole surface of the storage electrode, and forming a plate electrode by coating a third polycrystalline silicon layer on the whole surface of the resultant structure.

In another aspect of the present invention for accomplishing the above object, a method is shown for manufacturing a capacitor of a semiconductor memory device comprising the steps of forming an insulating layer for insulating a transistor, forming a contact hole in the insulating layer to electrically connect to a source region by etching the insulating layer, forming a first polycrystalline silicon layer on the whole surface of the semiconductor substrate having the contact hole therein, defining the first polycrystalline silicon layer for each cell, forming an oxide layer over the whole surface of the substrate on which the first polycrystalline silicon layer is formed for each cell, forming a second polycrystalline silicon layer over the oxide layer, dipping the semiconductor substrate having the second polycrystalline silicon layer thereon into an oxide etchant, and partially etching the oxide layer by the oxide etchant penetrating the periphery of grains constituting the second polycrystalline silicon layer, completely removing the second polycrystalline silicon layer and, at the same time, partially removing the first polycrystalline silicon layer, by an isotropic etching using the remaining oxide layer, which was unaffected by the oxide etchant, as a mask, removing the remaining oxide layer, forming a dielectric film on the whole surface of the semiconductor substrate from which the remaining oxide layer is removed, and forming a plate electrode by coating a third polycrystalline silicon layer on the whole surface of the resultant structure.

BRIEF DESCRIPTION OF THE DRAWINGS

The present invention will now be described in more detail with reference to the attached drawings in which.

DESCRIPTION OF THE PREFERRED EMBODIMENTS

Figure 1:
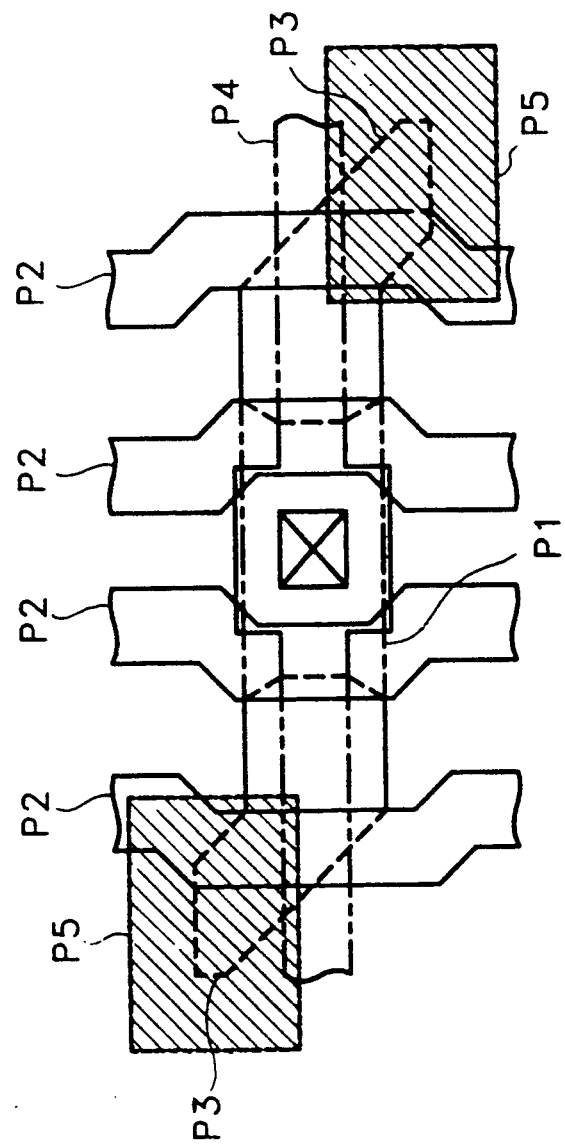
FIG. 1 is a layout of a COB cell used for manufacturing a highly integrated semiconductor memory device.
Figure 2A:
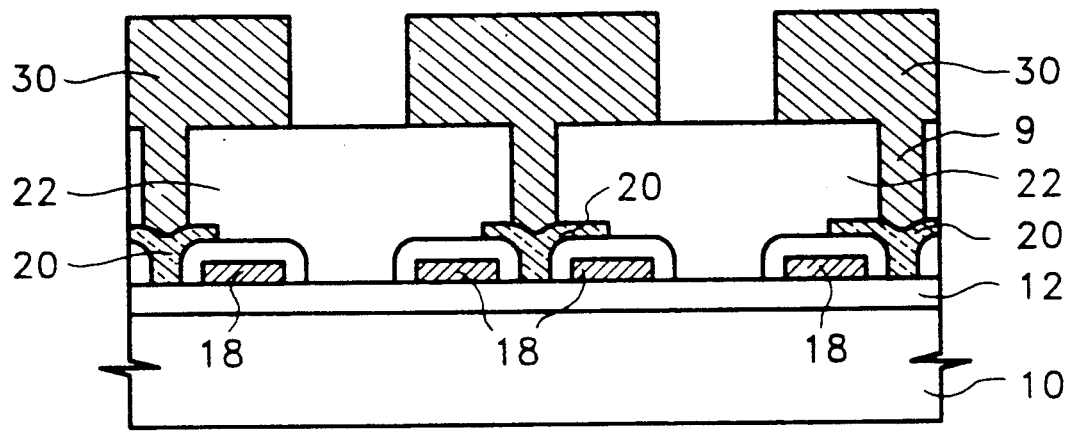
FIG. 2A through FIG. 2D are cross sectional views showing a conventional method for manufacturing a capacitor of a highly integrated semiconductor memory device.
Figure 2B:
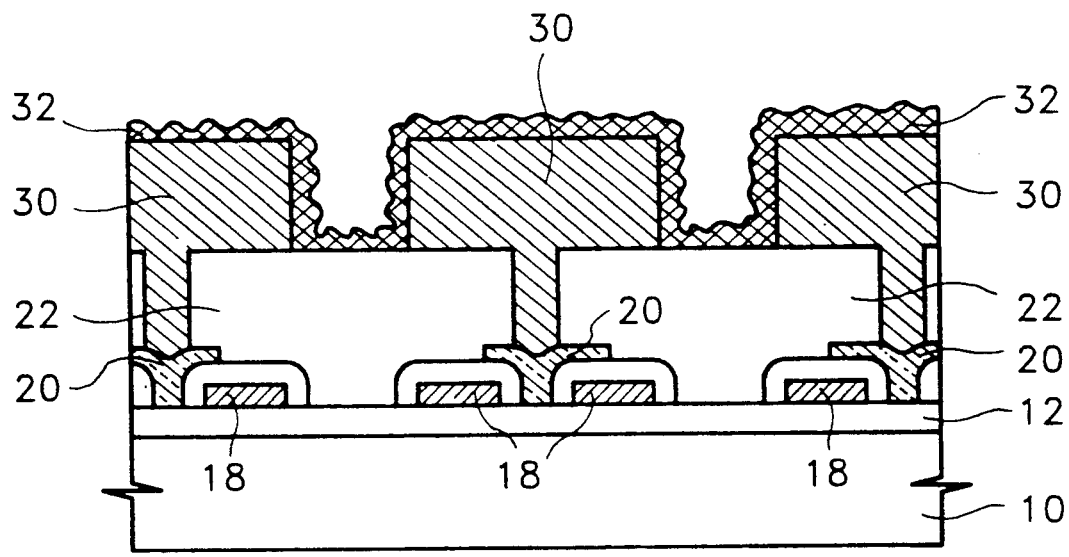
Figure 2C:
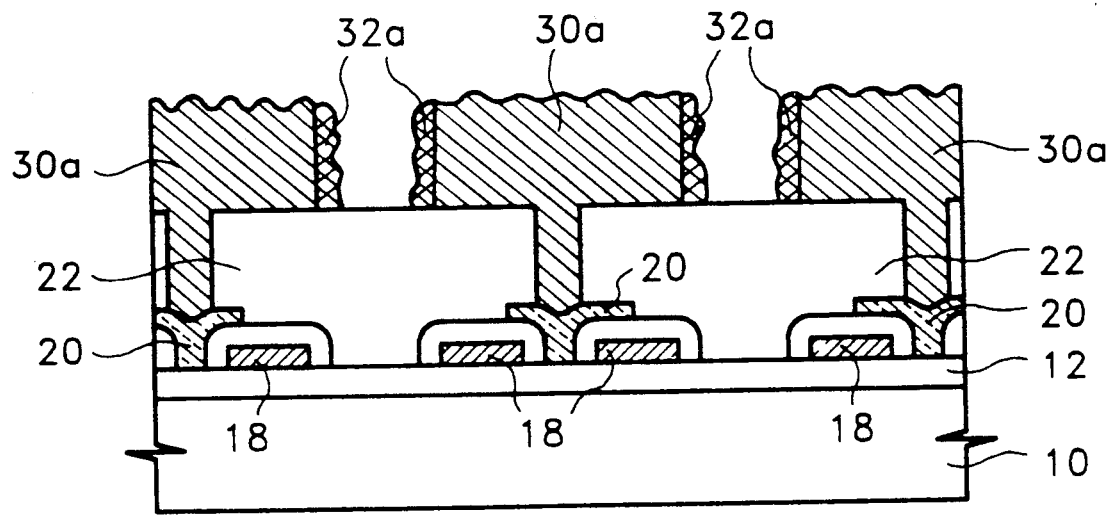
Figure 2D:
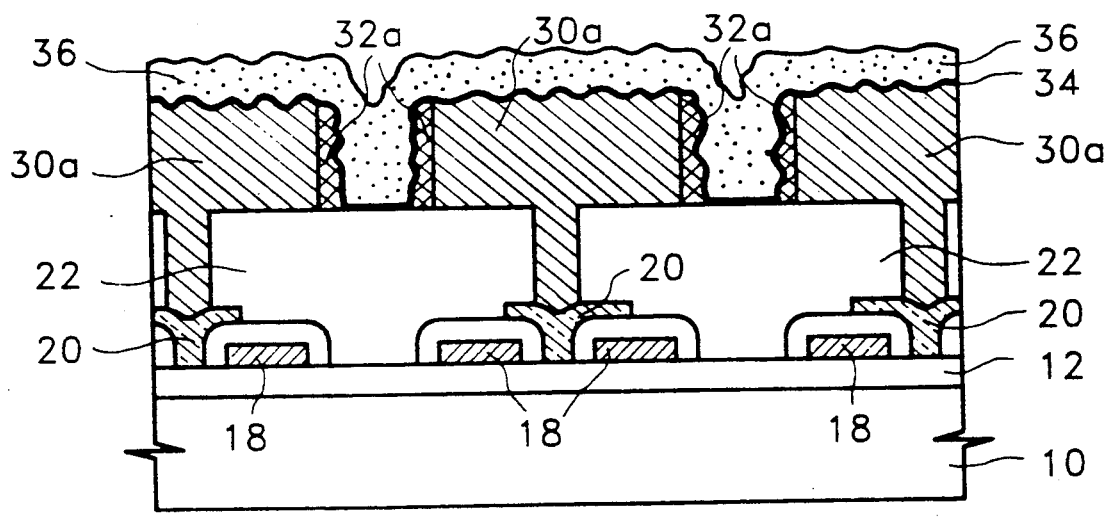
Figure 3:
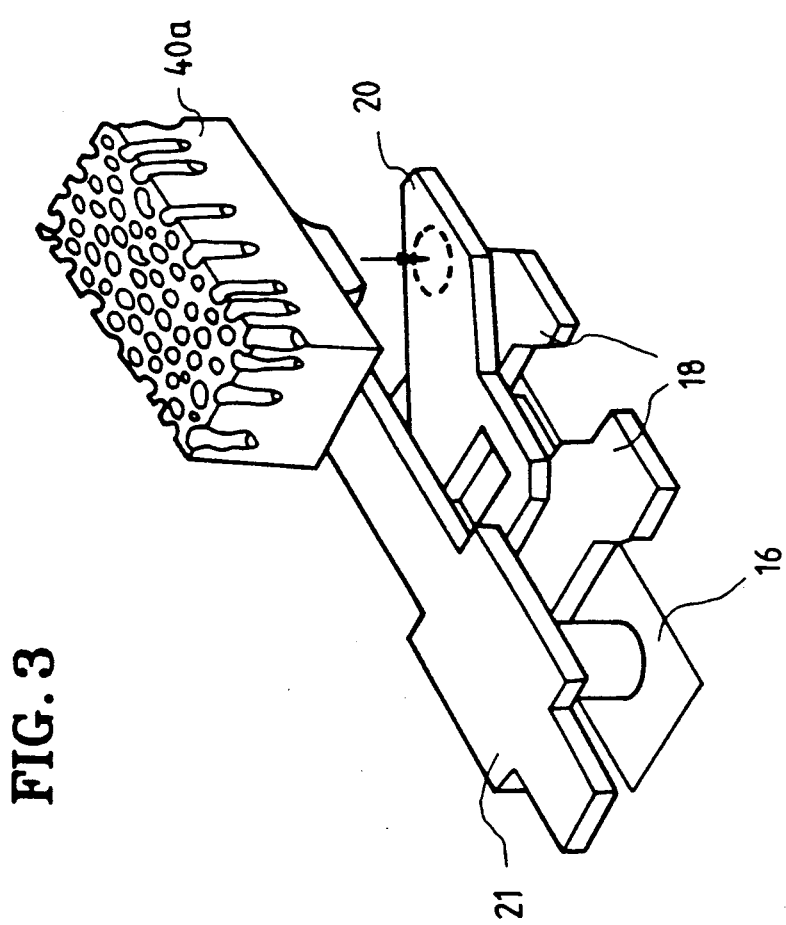
FIG. 3 is a perspective view of a highly integrated semiconductor memory device manufactured in accordance with a first embodiment of the present invention.

In FIG. 3, a highly integrated semiconductor memory device manufactured using the mask pattern in FIG. 1 comprises a transistor consisting of a source region (not shown), a drain region 16 and a gate electrode 18, a local interconnect 20 for connecting the source region of the transistor to a storage electrode 40a, a bit line 21 for contacting with the drain region of the transistor, and the storage electrode 40a.

One embodiment of a method for manufacturing the highly integrated semiconductor memory device of FIG. 3 according to the present invention is described below in detail with reference to FIG. 4A through FIG. 4E.

Figure 4A:
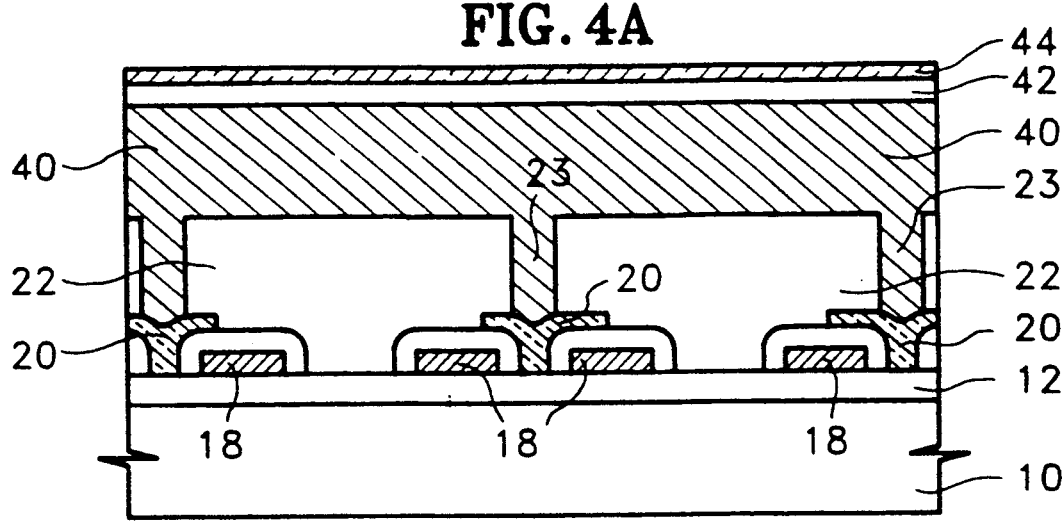
FIG. 4A through FIG. 4E are cross sectional views of the method of the first embodiment for manufacturing a highly integrated semiconductor memory device according to the present invention.

FIG. 4A illustrates a process for stacking a first polycrystalline silicon layer 40, an oxide layer 42 and a second polycrystalline silicon layer 44. First, an insulating layer 22 (strictly speaking, two or three layers are stacked instead of one) is formed on the whole surface of a semiconductor substrate 10 on which both the local interconnect 20 in contact with the source region of the transistor and the bit line in contact with the drain region, have been formed. Then, a contact hole 23 for exposing a portion of the local interconnect is formed by anisotropic etching. Successively, a first polycrystalline silicon layer 40 fills the contact hole 23, and is deposited to a predetermined thickness, e.g., about 4,000Å to 6,000Å, on the insulating layer via LPCVD. The oxide layer 42 having a predetermined thickness, e.g., about 500Å to 3,000Å, is coated or grown on the whole surface of the first polycrystalline silicon layer. The second polycrystalline silicon layer 44 is stacked, e.g., via LPCVD to a thickness of about 200Å to 2,000Å, over the oxide layer 42.

The second polycrystalline silicon layer 44 functions as an important factor for expanding the effective area of a cell capacitor in the present invention, that is because the cell capacitance is increased by using the periphery of grains which form the second polycrystalline silicon layer 44.

If amorphous silicon is coated on a substrate and then annealed, clumps of silicon having similar crystalline structure (hereinafter, referred to as grains) are formed. The polycrystalline silicon is the gatherings of the grains. Generally, the bonding strength between each silicon in a grain is strong. However, the bonding is mechanically weak where a grain is in contact with other grains due to the different crystalline structures, and particularly weak at that location were three or four grains are in contact with one another. Also, these regions possess a high energy level and much residue stress, the etch rate is therefore high.

Further, if an impurity, e.g., phosphorus oxychloride (POCl$_3$), is doped in the surface of the second polycrystalline silicon layer 44, the number of bondings, between impurity ions and silicon ions at the periphery of grains coming into contact with one another, becomes much more than at other regions due to the aforesaid high energy state. Accordingly, the etch rate becomes high, and phosphorus pentoxide (P$_2$O$_5$) is formed. These phenomena accelerate the consumption of the second polycrystalline silicon, and in turn decreases the original thickness of the second polycrystalline silicon layer, thereby lessening the resistance to etching as compared with that at the other regions. In addition to using phosphorus oxychloride (POCl$_3$), the oxidation thinning down the polycrystalline silicon layer is utilized for all oxidation processes. The lessened thickness of the polycrystalline silicon layer 44 allows the above region to be easily eroded by a wet etching.

The present invention uses the above-mentioned physical properties of material appearing at the periphery of a grain. When the oxide layer and the second thin polycrystalline silicon layer are sequentially stacked on the first polycrystalline silicon, and are exposed to an oxide etchant, the oxide etchant breaks the weak bonding strength at the grain peripheries constituting the second polycrystalline silicon layer 44, and partially etches the oxide layer by penetrating through the second polycrystalline silicon layer 44. Successively, when the etching process is performed thereupon for removing the second polycrystalline silicon layer 44, but also some of the first polycrystalline silicon layer 40 is partially etched because the oxide layer 42 has been partially etched by the oxide etchant. Here, the first 40 and second 44 polycrystalline silicon layers are deposited to have the same etch rate with respect to the etching process, or slightly different etch rates, and the oxide layer 42 which remains unaffected by the oxide etchant is used as a mask during the etching process.

In the above description, the size of the oxide layer 42 used as an etch-mask is proportional to the size of the grain. Hence, the smaller the grain size the greater the capacitance which can be obtained.

The grain size in the polycrystalline silicon is strongly dependent on the initial nucleation rate in the amorphous silicon layer. Thus, the greater the initial nucleation rate the smaller the grain size that will be formed.

The following Table 1 shows variations of the maximum grain size according to a deposition temperature, a nucleation rate, and a growth rate, which is quoted for the paper entitled "A High-Performance Stacked-CMOS SRAM cell by Solid Phase Growth Technique" in a Journal under the title of "1990 Symposium on VLSI Technology."

TABLE 1

| deposition temperature C.° | nucleation rate (/cm$^2$ · sec) | growth rate (nm/sec) | maximum grain size ($\mu$m) |
|---|---|---|---|
| 455 | 280 | 0.13 | 7 |
| 485 | 810 | 0.14 | 5 |
| 515 | 1100 | 0.13 | 3.5 |

Referring to Table 1, when the growth rate is maintained constant, the maximum grain size can be varied according to the initial nucleation rate in the amorphous silicon layer. The initial nucleation rate in turn depends on the deposition temperature. This means that the cell capacitance is greatly influenced by the deposition temperature. Accordingly, the desired cell capacitance can be obtained by controlling the deposition temperature.

Figure 4B:
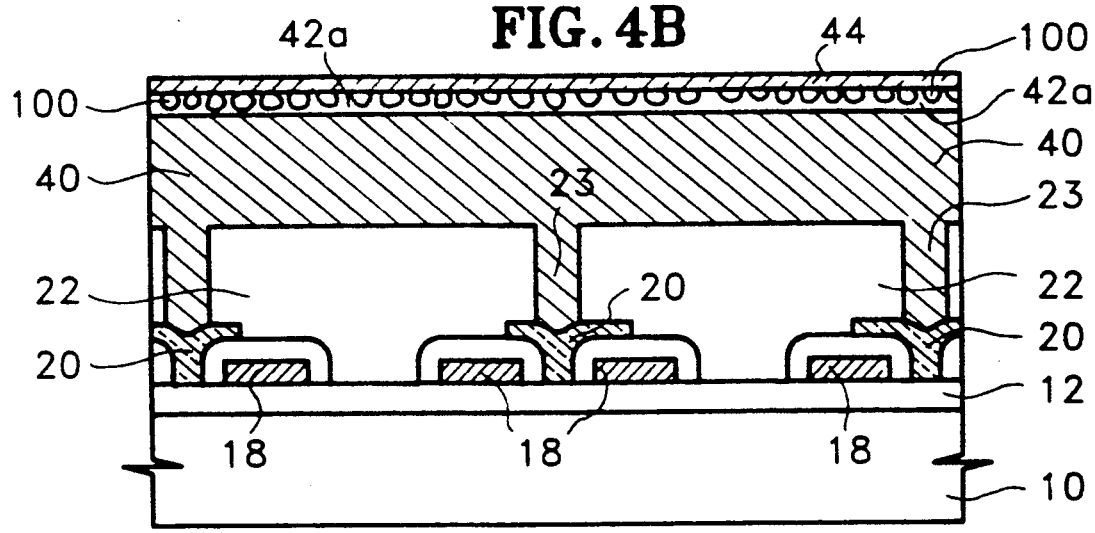

FIG. 4B illustrates a process for forming an oxide layer mask 42a. When the second polycrystalline silicon layer 44 formed on the semiconductor substrate is exposed to an oxide etchant, such as BOE (Buffered Oxide Etchant—a mixture of ammonium fluoride (NH4F) and hydrogen fluoride (HF)), the oxide etchant penetrates the peripheries of the grains constituting the second polycrystalline silicon layer 44, and then etches the oxide layer 42. Thus, an apertured oxide layer mask 42a is obtained in which holes 100 are too minute to be restricted by limitation of minimum feature size.

The etching process using an oxide etchant is remarkable in that an object can be etched by a wet etching to a size smaller than that practically feasible by way of a masking pattern.

Figure 4C:
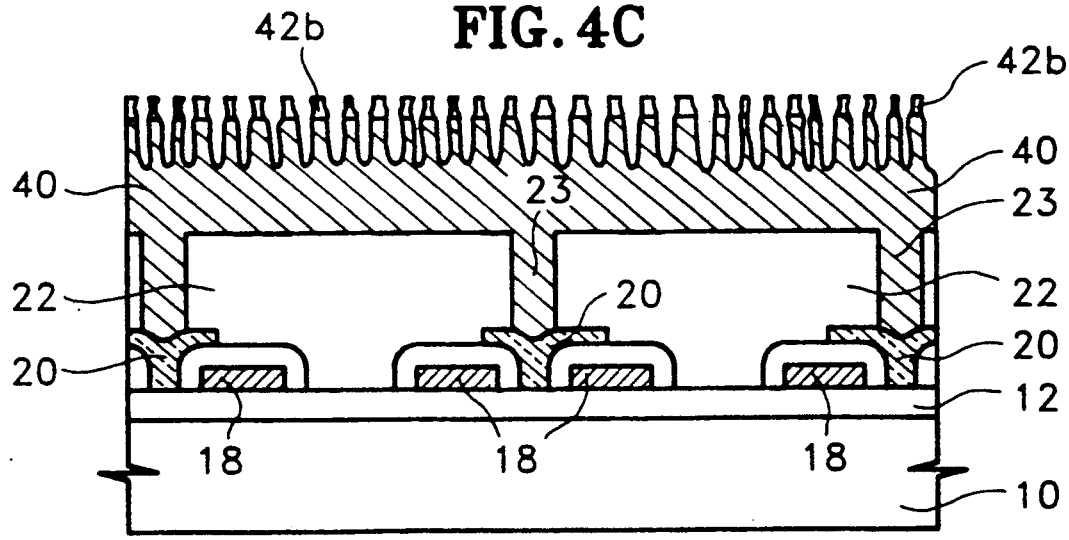

FIG. 4C illustrates a process for removing the second polycrystalline silicon layer 44 and, at the same time, etching partially the first polycrystalline silicon layer 40. The second polycrystalline silicon layer 44, which remains on the apertured oxide layer mask 42a with minute holes 100 formed by the oxide etchant, is removed by anisotropic-etching. Since the first and second polycrystalline silicon layers have similar or the same etch rate with respect to the anisotropic-etching, it is possible to remove all of the second polycrystalline silicon layer 44, and portions of the first polycrystalline silicon layer 40 using the apertured oxide layer mask 42a exposed by the etching process.

Also, the etching depth of the first polycrystalline silicon layer 40 can be adjusted by varying the processing time of the anisotropic etching. The cell capacitance is greatly influenced by not only the grain size but also the etching depth. For example, if the etched depth of the first polycrystalline silicon layer 40 is three times the diameter of the hole 100, its surface area is increased ten times or more. The surface area can be calculated by the formula: $(6r \times 2\pi r) + \pi r^2$, where "r" is the radius of the hole. Consequently, the surface area is increased about thirteen times.

Figure 4D:
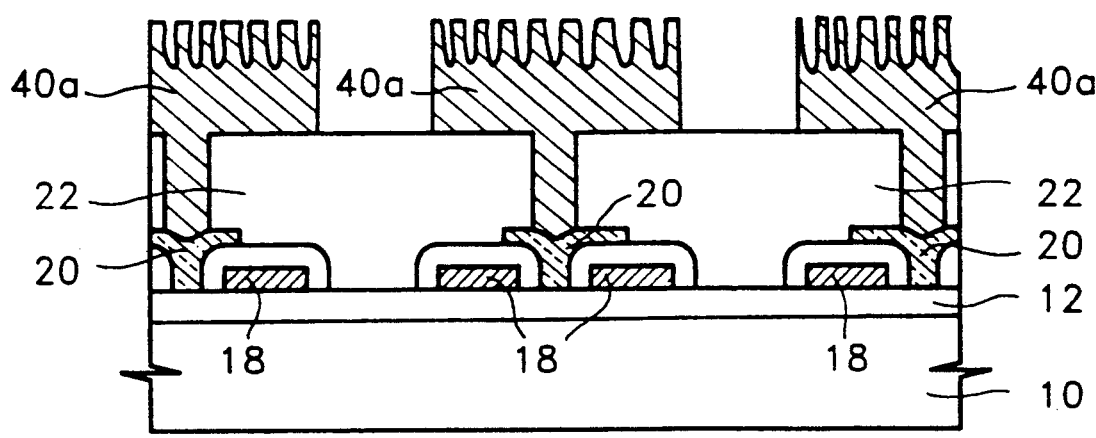

FIG. 4D illustrates a process for forming a storage electrode 40a into cell units. After the whole surface of the honeycomb-like first polycrystalline silicon layer 40 etched by the anisotropic etching is covered with photoresist, a photoresist pattern is formed using the mask pattern P5. Then, the first polycrystalline silicon layer 40 is anisotropically etched using the photoresist pattern as a mask, so that the cell-defined storage electrode 40a is completed.

Figure 4E:
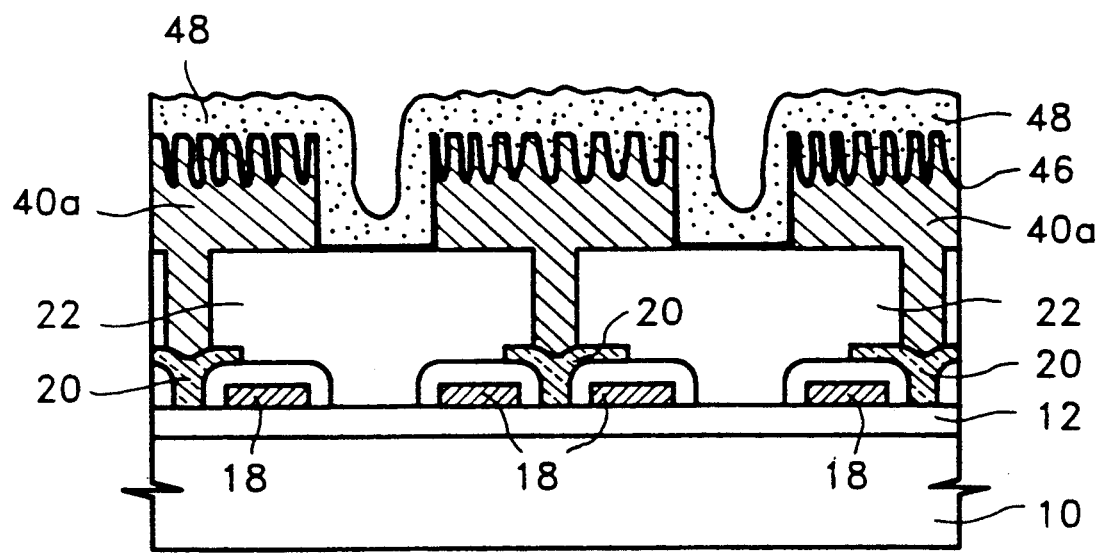

FIG. 4E illustrates a process for forming a dielectric film 46 and a plate electrode 48. A dielectric of a high dielectric constant, e.g., tantalum oxide ($Ta_2O_5$), is very thinly formed on the whole surface of the semiconductor substrate 10 on which the storage electrode 40a has been formed. Thereafter, a third polycrystalline silicon layer serving as the plate electrode 48 is formed. Finally, a cell capacitor comprising the storage electrode 40a, the dielectric film 46 and the plate electrode 48 is completed. Here, the storage electrode is connected to the local interconnect 20 through the contact hole 23 formed in the insulating layer 22, and the local interconnect is connected to the source region 14 of the transistor.

Figure 5:
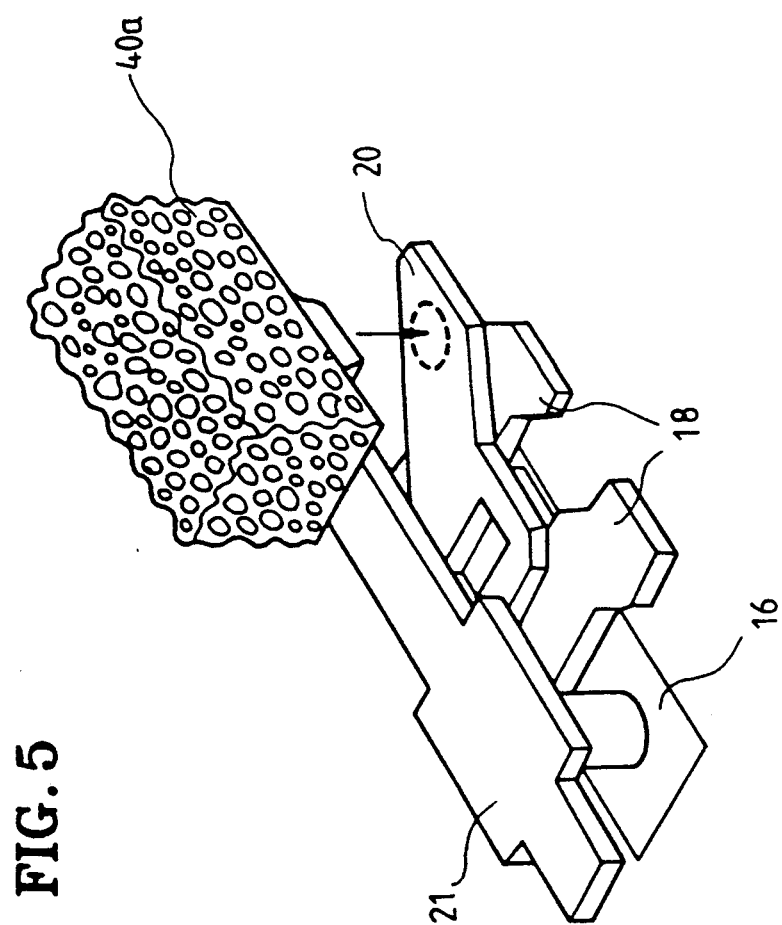
FIG. 5 is a perspective view of a highly integrated semiconductor memory device manufactured in accordance with a second embodiment of the present invention.

FIG. 5 is a perspective view of a highly integrated semiconductor memory device manufactured by a second embodiment of the method according to the present invention. The structure is substantially identical to that shown in the first embodiment of FIG. 3, however the shape of the storage electrode is variably different.

Referring to FIGS. 6A to 6E, the second embodiment of a method for manufacturing a highly integrated semiconductor memory device shown in FIG. 5 will now be illustrated.

Figure 6A:
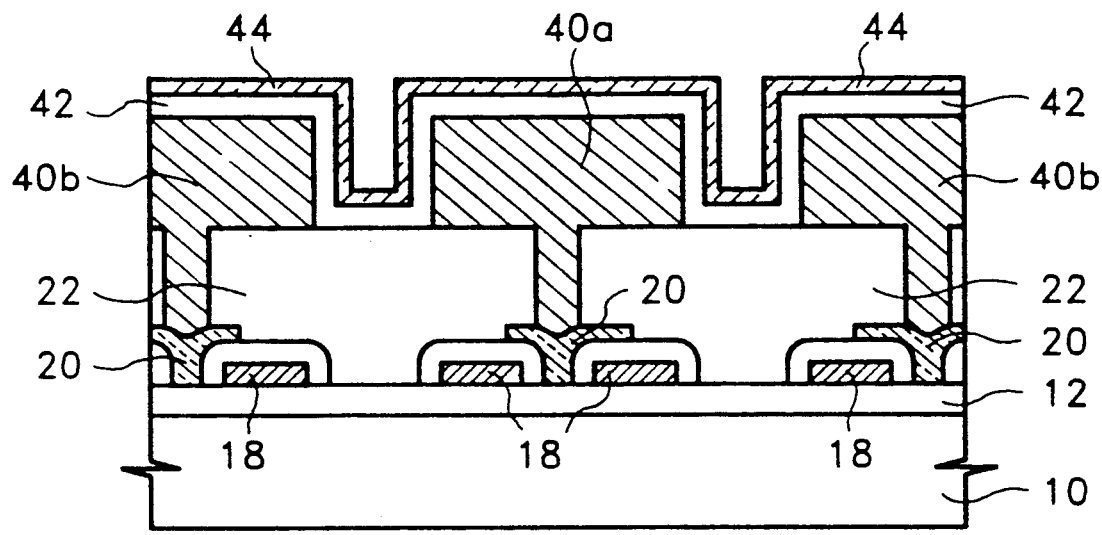
FIG. 6A through FIG. 6E are cross sectional views of the method of the second embodiment for manufacturing a highly integrated semiconductor memory device according to the present invention.

FIG. 6A illustrates a process for stacking a first polycrystalline silicon layer 40b, an oxide layer 42 and a second polycrystalline silicon layer 44. The first polycrystalline silicon layer 40b is formed by the similar method of the above-described first embodiment, then patterned to define corresponding cell units, using mask pattern P5. This scheme is a variably different alternative from the above first embodiment in which the formation process is performed without first patterning the first polycrystalline silicon layer 40.

Thereafter, the oxide layer 42 and the second polycrystalline silicon layer 44 are stacked on the whole surface of the semiconductor substrate on which the patterned first polycrystalline silicon layer 40b is formed.

Figure 6B:
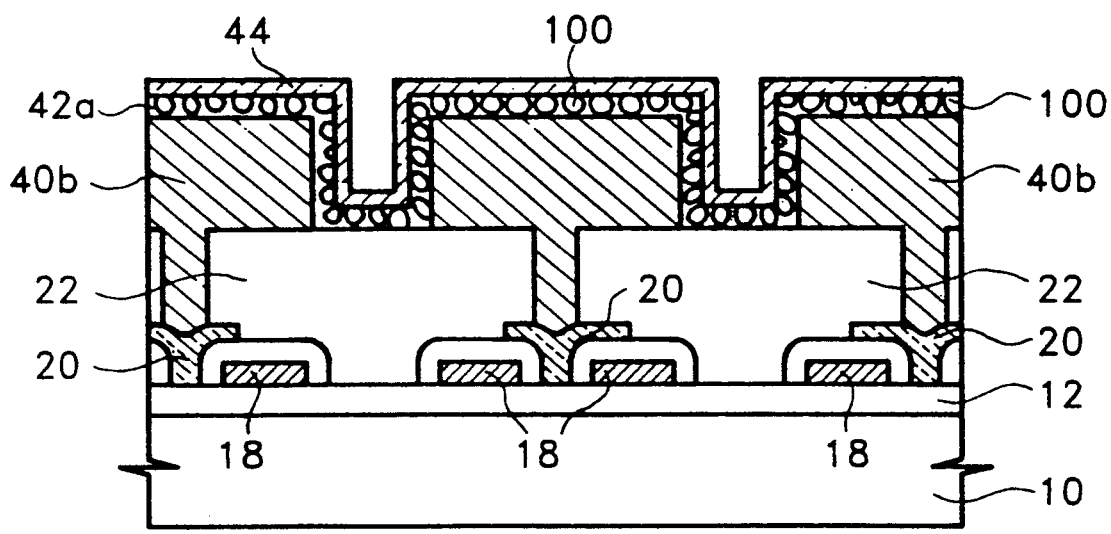

FIG. 6B illustrates a process for forming an oxide layer mask 42a, of which thickness is below limitation of minimum feature size by using an oxide etchant, e.g., BOE, in a method similar to the first embodiment (shown by FIG. 4B). Holes 100 are spaces that are formed after removing portions of the oxide layer 42a by the oxide etchant.

Figure 6C:
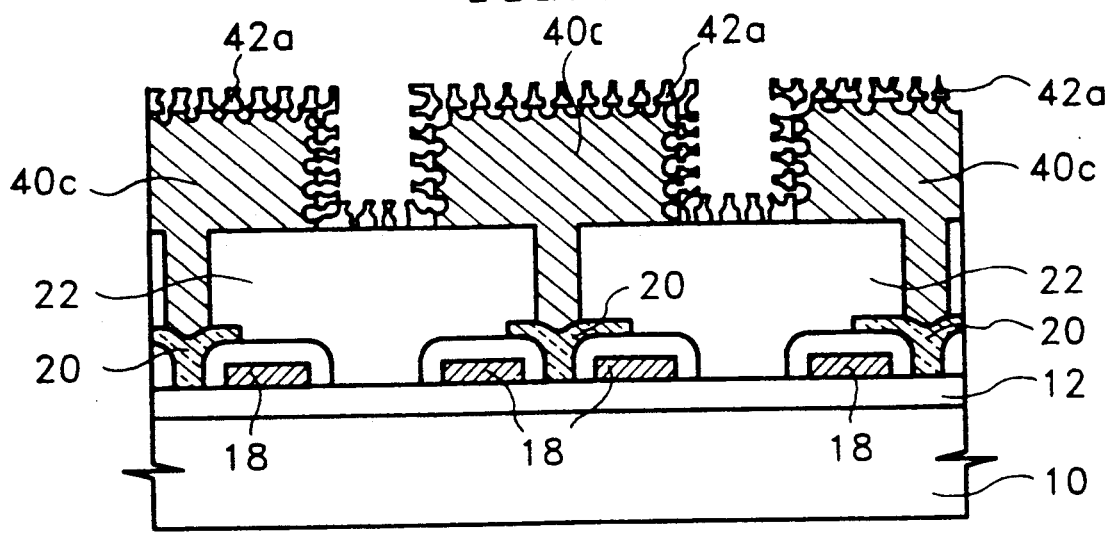

FIG. 6C illustrates a process for removing the second polycrystalline silicon layer 44 and, at the same time, partially etching the first polycrystalline silicon layer 40b. An isotropic etching process is performed in order to remove the second polycrystalline silicon layer 44 which remains on the apertured oxide layer mask 42a with minute holes 100 formed by the oxide etchant. The isotropic etching process does more than completely remove the second polycrystalline silicon layer. It also partially removes the first polycrystalline silicon layer 40b using the oxide layer mask 42a whose surface is exposed by the etching process. This is possible because the first and second polycrystalline silicon layers have similar or the same etch rates.

Since the oxide mask 42a functions similar to the second polycrystalline silicon layer in FIG. 6B, the isotropic etching can be performed by either a wet etching or a dry etching. Also, in addition to the upper surface of the first polycrystalline silicon layer 40c, the side surfaces are etched by the isotropic etching. Its entire surface is thus formed similar to the conventional HSG polycrystalline silicon. The surface of the conventional HSG polycrystalline silicon is in the shape of an outwardly protruding hemisphere like a cap, but that of the first polycrystalline silicon layer 40c is in the shape of an inwardly recessing hemisphere like a cup. The conventional HSG polycrystalline silicon layer is formed by a special process under specific conditions on the whole surface of a core storage electrode. An etching process is then performed again. That is, the process for retaining an uneven surface on the core storage electrode should be added. However, it is sufficient that the semiconductor substrate having the oxide layer mask 42a thereon is exposed to the isotropic etching in the present invention. It should be noted that the degree of unevenness of the first polycrystalline silicon layer's surface can be adjusted in accordance with the processing time of the isotropic etching and the concentration of the etchant.

Figure 6D:
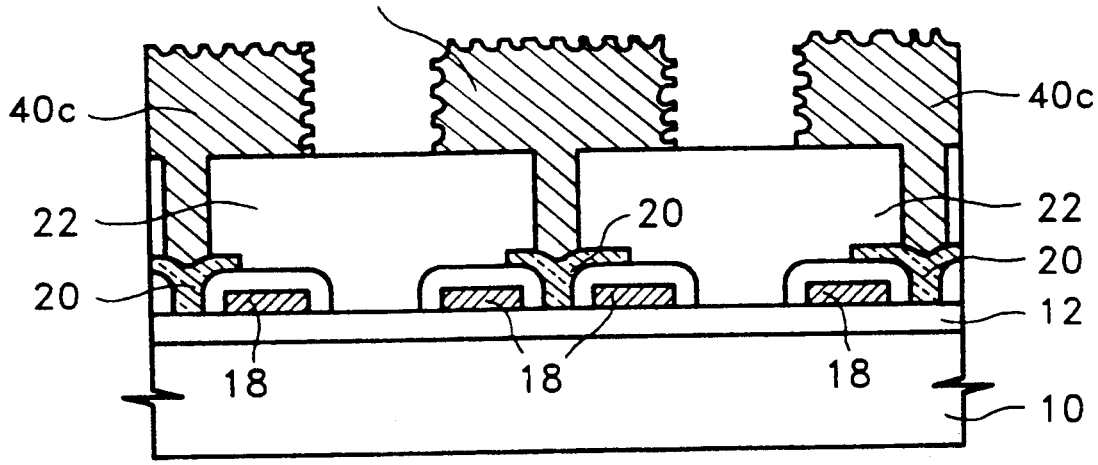
Figure 6E:
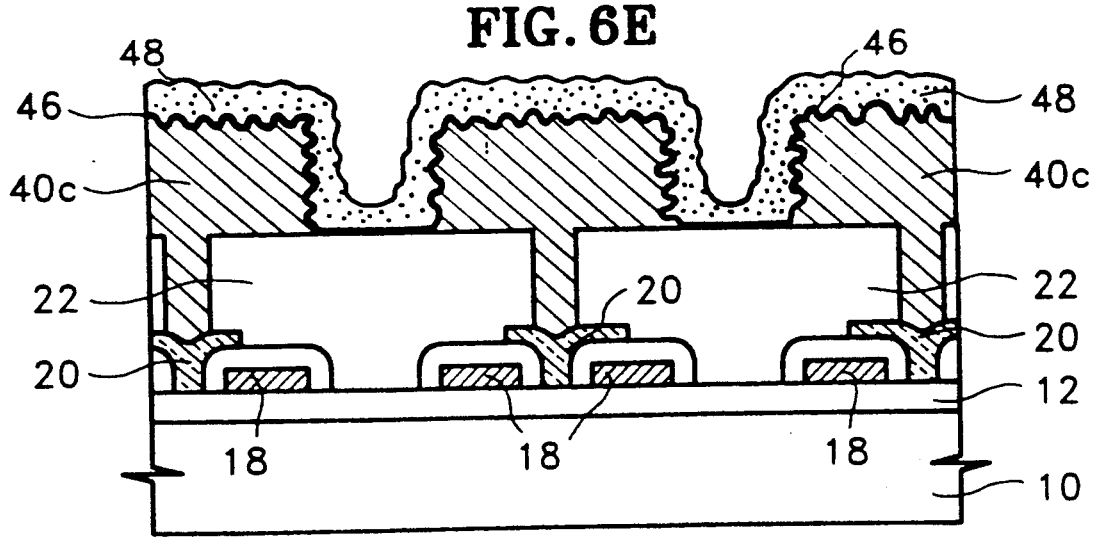

FIG. 6D and FIG. 6E illustrate a process for forming a dielectric film 46 and a plate electrode 48. After the storage electrode 40c is formed by removing the oxide layer mask 42a, the dielectric film 46 is formed on the whole surface of the substrate 10 on which the storage electrode 40c has been formed. Successively, a third polycrystalline silicon layer 48 serving as the plate electrode is stacked, thereby completing a cell capacitor including the storage electrode 40c, the dielectric film 46 and the plate electrode 48.

As compared with the method for manufacturing the conventional HSG storage electrode which has limited process margin due to the fact that specific conditions are required, and has limitations in increasing cell capacitance, the manufacturing method according to the present invention requires no specific conditions while taking advantage of the physical properties of the materials used. Further, the present method is free from limitation of minimum feature size, is more simplistic, and successfully extends the effective area of a cell capacitor.

While this invention has been described in connection with what is presently considered to be the most practical and preferred embodiment, it is to be understood that the invention is not limited to the disclosed embodiment, but, on the contrary, is intended to cover various modifications and equivalent arrangements included within the spirit and scope of the appended claims.

What is claimed is:

1. In a method for manufacturing a capacitor of a highly integrated semiconductor memory device including a plurality of memory cells regularly arranged on a semiconductor substrate, each of which has a transistor having a source region, a drain region and a gate electrode, and a capacitor having a storage electrode, a dielectric film and a plate electrode and said storage electrode being electrically connected to said source region of said transistor, said method comprising the steps of:

forming an insulating layer for insulating said transistor;

forming a contact hole in the insulating layer to expose said source region of said transistor by etching said insulating layer;

forming a first polycrystalline silicon layer on the whole surface of the insulating layer and within said contact hole;

forming an oxide layer over said first polycrystalline silicon layer;

forming a second polycrystalline silicon layer over said oxide layer, said second polysilicon layer composed of grains;

dipping said semiconductor substrate having said second polycrystalline silicon layer thereon into an oxide etchant, and partially etching said oxide layer by the oxide etchant penetrating peripheries of said grains constituting said second polycrystalline silicon layer;

completely removing said second polycrystalline silicon layer and, at the same time, partially removing said first polycrystalline silicon layer by an anisotropic etching using as a mask the remaining oxide layer not removed by said oxide etchant;

removing said remaining oxide layer;

forming a storage electrode by removing a portion of said first polycrystalline silicon layer having said partially removed surface;

forming a dielectric film over said storage electrode; and forming a plate electrode by coating a third polycrystalline silicon layer over said dielectric film.

2. A method for manufacturing a capacitor of a highly integrated semiconductor memory device as claimed in claim 1, wherein the thickness of said first polycrystalline silicon layer is approximately 3,000Å to 10,000Å.

3. A method for manufacturing a capacitor of a highly integrated semiconductor memory device as claimed in claim 2, wherein the thickness of said first polycrystalline silicon layer is preferable to be 4,000Å to 6,000Å.

4. A method for manufacturing a capacitor of a highly integrated semiconductor memory device as claimed in claim 1, wherein the thickness of said oxide layer is approximately 500Å to 3,000Å.

5. A method for manufacturing a capacitor of a highly integrated semiconductor memory device as claimed in claim 1, wherein the thickness of said second polycrystalline silicon layer is 200Å to 2,000Å.

6. A method for manufacturing a capacitor of a highly integrated semiconductor memory device as claimed in claim 1, wherein the etch rate of said periphery grains contained within said second polycrystalline silicon layer is higher than that of any other region due to the doping of phosphorus oxychloride ($POCl_3$).

7. A method for manufacturing a capacitor of a highly integrated semiconductor memory device as claimed in claim 1, wherein the thickness of polycrystalline silicon at the periphery of a grain contained within said second polycrystalline silicon layer is thinned down by a slight oxidation as compared with the original thickness.

8. A method for manufacturing a capacitor of a highly integrated semiconductor memory device as claimed in claim 1, wherein the effective area of said cell capacitor is increased in response to an increase in the second polycrystalline silicon layer grain density.

9. A method for manufacturing a capacitor of a highly integrated semiconductor memory device as claimed in claim 1, wherein the effective area of said cell capacitor is adjusted according to the etching time of said anisotropic etching and the etchant concentration thereof.

10. A method for manufacturing a capacitor of a highly integrated semiconductor memory device as claimed in claim 1, wherein said oxide etchant is a Hydrofluoric acid (HF) solution.

11. A method for manufacturing a capacitor of a highly integrated semiconductor memory device as claimed in claim 1, wherein said first and second polycrystalline silicon layers have the same etching rate under the conditions of said anisotropic etching.

12. A method for manufacturing a capacitor of a highly integrated semiconductor memory device as claimed in claim 1, wherein said first and second polycrystalline silicon layers have similar etch rate under the conditions of said anisotropic etching.

13. A method for manufacturing a capacitor of a highly integrated semiconductor memory device as claimed in claim 1, wherein the etch rate of said oxide layer is greatly different from that of said first and second polycrystalline silicon layers under the conditions of said anisotropic etching.

14. In a method for manufacturing a capacitor of a highly integrated semiconductor memory device including a plurality of memory cells arranged on a semiconductor substrate, each of which has a transistor having a source region, a drain region and a gate electrode, and a capacitor having a storage electrode, a dielectric film and a plate electrode and said storage electrode being electrically connected to said source region of said transistor, said method comprising the steps of:

forming an insulating layer for insulating said transistor:

forming a contact hole in the insulating layer to expose said source region of said transistor by etching said insulating layer;

forming a first polycrystalline silicon layer on the whole surface of the insulating layer and within said contact hole;

defining said first polycrystalline silicon layer into cell units by removing portions of said first polycrystalline silicon layer;

forming an oxide layer over the whole surface of the substrate on which said first polycrystalline silicon layer are formed for each cell;

forming a second polycrystalline silicon layer over said oxide layer, said second polycrystalline layer composed of grains;

dipping said semiconductor substrate having said second polycrystalline silicon layer thereon into an oxide etchant, and partially etching said oxide layer through penetration of said oxide etchant along said peripheries of said grains of said second polycrystalline silicon layer;

completely removing said second polycrystalline silicon layer and, at the same time, partially removing said first polycrystalline silicon layer by an isotropic etching using as a mask the remaining oxide layer not removed by said oxide etchant;

removing said remaining oxide layer;

forming a dielectric film on the whole surface of said semiconductor substrate from which said remaining oxide layer is removed; and forming a plate electrode by coating a third polycrystalline silicon layer over said dielectric film.

15. A method for manufacturing a capacitor of a highly integrated semiconductor memory device as claimed in claim 14, wherein the effective area of said cell capacitor is increased in response to an increase in the second polycrystalline silicon layer grain density.

16. A method for manufacturing a capacitor of a highly integrated semiconductor memory device as claimed in claim 14, wherein the effective area of said cell capacitor is adjusted according to the etching time of said isotropic etching and the etchant concentration thereof.

17. A method for manufacturing a capacitor of a highly integrated semiconductor memory device as claimed in claim 14, wherein said isotropic etching is a dry etching.

18. A method for manufacturing a capacitor of a highly integrated semiconductor memory device as claimed in claim 17, wherein said first and second polycrystalline silicon layers have the same etch rate under the conditions of said dry etching.

19. A method for manufacturing a capacitor of a highly integrated semiconductor memory device as claimed in claim 17, wherein said first and second polycrystalline silicon layers have similar etch rates under the conditions of said dry etching.

20. A method for manufacturing a capacitor of a highly integrated semiconductor memory device as claimed in claim 14, wherein said isotropic etching is a wet etching.

21. A method for manufacturing a capacitor of a highly integrated semiconductor memory device as claimed in claim 20, wherein said first and second polycrystalline silicon layers have the same etch rate under the conditions of said wet etching.

22. A method for manufacturing a capacitor of a highly integrated semiconductor memory device as claimed in claim 20, wherein said first and second polycrystalline silicon layers have similar etch rates under the conditions of said wet etching.

23. A method for manufacturing a capacitor of a highly integrated semiconductor memory device as claimed in claim 14, wherein the etch rate of said oxide layer is considerably different from those of said first and second polycrystalline silicon layers under the conditions of said isotropic etching.

* * * * *